US010023958B2

(12) United States Patent
Nguyen et al.

(10) Patent No.: US 10,023,958 B2
(45) Date of Patent: Jul. 17, 2018

(54) ATOMIC LAYER DEPOSITION OF FILMS COMPRISING SILICON, CARBON AND NITROGEN USING HALOGENATED SILICON PRECURSORS

(71) Applicant: Applied Materials, Inc., Santa Clara, CA (US)

(72) Inventors: Victor Nguyen, Novato, CA (US); Ning Li, San Jose, CA (US); Mihaela Balseanu, Sunnyvale, CA (US); Li-Qun Xia, Cupertino, CA (US); Mark Saly, Santa Clara, CA (US); David Thompson, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 225 days.

(21) Appl. No.: 14/533,496

(22) Filed: Nov. 5, 2014

(65) Prior Publication Data

US 2015/0147484 A1 May 28, 2015

Related U.S. Application Data

(60) Provisional application No. 61/907,717, filed on Nov. 22, 2013.

(51) Int. Cl.
*C23C 16/455* (2006.01)
*C23C 16/34* (2006.01)
*C23C 16/36* (2006.01)

(52) U.S. Cl.
CPC ...... *C23C 16/45553* (2013.01); *C23C 16/345* (2013.01); *C23C 16/36* (2013.01); *C23C 16/4554* (2013.01); *C23C 16/45536* (2013.01); *C23C 16/45542* (2013.01)

(58) Field of Classification Search
None
See application file for complete search history.

(56) References Cited

U.S. PATENT DOCUMENTS

| 5,186,718 A | 2/1993 | Tepman et al. |
| 6,818,250 B2 | 11/2004 | George et al. |
| 7,897,208 B2 | 3/2011 | Mahajani et al. |
| 8,329,599 B2 | 12/2012 | Fukazawa et al. |
| 2009/0137132 A1 | 5/2009 | Bhatia et al. |

(Continued)

FOREIGN PATENT DOCUMENTS

| TW | 201327679 A1 | 7/2013 |
| WO | WO-2009/149167 | 12/2009 |

OTHER PUBLICATIONS

PCT International Preliminary Report on Patentability in PCT/US2014/065421 dated Jun. 2, 2016, 8 pages.

(Continued)

*Primary Examiner* — Joel G Horning
(74) *Attorney, Agent, or Firm* — Servilla Whitney LLC

(57) ABSTRACT

Provided are methods for the deposition of films comprising SiCN. Certain methods involve exposing a substrate surface to a silicon precursor, wherein the silicon precursor is halogenated with Cl, Br or I, and the silicon precursor comprises a halogenated silane, a halogenated carbosilane, an halogenated aminosilane or a halogenated carbo-sillyl amine. Then, the substrate surface can be exposed to a nitrogen-containing plasma or a nitrogen precursor and densification plasma.

6 Claims, 6 Drawing Sheets

(56) References Cited

U.S. PATENT DOCUMENTS

| | | |
|---|---|---|
| 2010/0124618 A1 | 5/2010 | Kobayashi et al. |
| 2010/0304047 A1 | 12/2010 | Yang et al. |
| 2012/0009802 A1* | 1/2012 | LaVoie .................. C23C 16/045 |
| | | 438/783 |
| 2012/0214318 A1 | 8/2012 | Fukazawa et al. |
| 2013/0071580 A1 | 3/2013 | Weidman et al. |
| 2013/0078376 A1 | 3/2013 | Higashino et al. |
| 2013/0244446 A1 | 9/2013 | Tsuji et al. |
| 2014/0273528 A1* | 9/2014 | Niskanen .............. C23C 16/345 |
| | | 438/792 |

OTHER PUBLICATIONS

Du, Y., et al., Mechanism of Pyridine-Catalyzed SiO2 Atomic Layer Deposition Studied by Fourier Transform Infrared Spectroscopy, *J. Phys. Chem. C* vol. 111 2007, 219-226.

Du, Y., et al., $SiO_2$ film growth at low temperatures by catalyzed atomic layer deposition in a viscous flow reactor, *Thin Solid Films* vol. 491 2005, 43-53.

Kim, Hyeong Joon, et al., Characterization of low-dielectric-constant $SiO_2$ thin films deposited by PECVD for interlayer dielectrics of multilevel interconnection, *Surface and Coatings Technology* vol. 171 2003, 39-45.

PCT International Search Report and Written Opinion in PCT/US2014/065421, dated Mar. 18, 2015, 11 pages.

\* cited by examiner

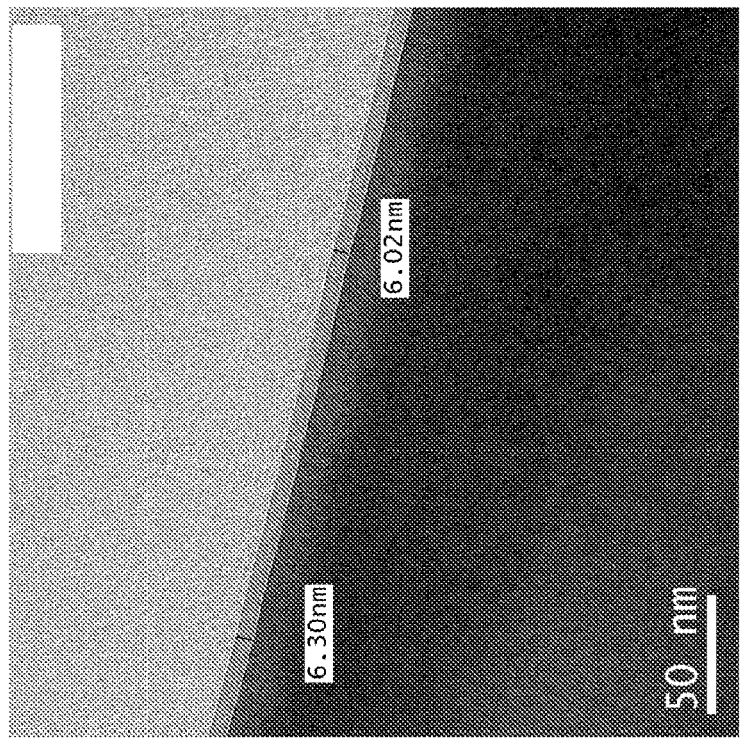
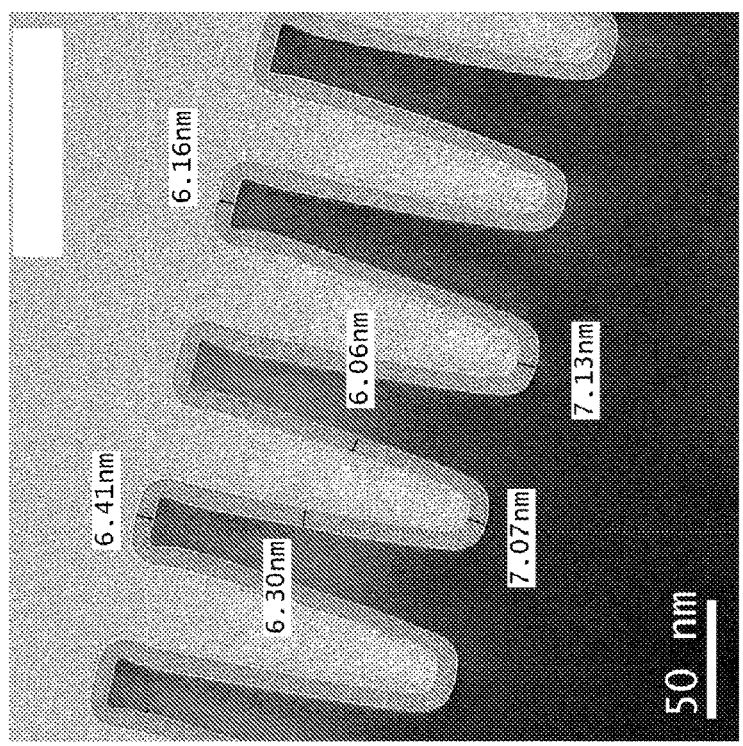
Figure 2A
Figure 2B

ATOMIC LAYER DEPOSITION OF FILMS COMPRISING SILICON, CARBON AND NITROGEN USING HALOGENATED SILICON PRECURSORS

CROSS-REFERENCE TO RELATED APPLICATIONS

This application claims priority to U.S. Provisional Application No. 61/907,717, filed Nov. 22, 2013.

TECHNICAL FIELD

The present invention relates generally to methods of depositing thin films. In particular, the invention relates to atomic layer deposition processes for the deposition films comprising silicon, carbon and nitrogen.

BACKGROUND

Deposition of thin films on a substrate surface is an important process in a variety of industries including semiconductor processing, diffusion barrier coatings and dielectrics for magnetic read/write heads. In the semiconductor industry, in particular, miniaturization requires atomic level control of thin film deposition to produce conformal coatings on high aspect structures. One method for deposition of thin films with control and conformal deposition is atomic layer deposition (ALD), which employs sequential, surface reactions to form layers of precise thickness. Most ALD processes are based on binary reaction sequences which deposit a binary compound film. Because the surface reactions are sequential, the two gas phase reactants are not in contact, and possible gas phase reactions that may form and deposit particles are limited.

ALD has been used to deposit metals and metal compounds on substrate surfaces. $Al_2O_3$ deposition is an example of a typical ALD process illustrating the sequential and self-limiting reactions characteristic of ALD. $Al_2O_3$ ALD conventionally uses trimethylaluminum (TMA, often referred to as reaction "A" or the "A" precursor) and $H_2O$ (often referred to as the "B" reaction or the "B" precursor). In step A of the binary reaction, hydroxyl surface species react with vapor phase TMA to produce surface-bound $AlOAl(CH_3)_2$ and $CH_4$ in the gas phase. This reaction is self-limited by the number of reactive sites on the surface. In step B of the binary reaction, $AlCH_3$ of the surface-bound compound reacts with vapor phase $H_2O$ to produce AlOH bound to the surface and $CH_4$ in the gas phase. This reaction is self-limited by the finite number of available reactive sites on surface-bound $AlOAl(CH_3)_2$. Subsequent cycles of A and B, purging gas phase reaction products and unreacted vapor phase precursors between reactions and between reaction cycles, produces $Al_2O_3$ growth in an essentially linear fashion to obtain the predetermined film thickness. Because of the usefulness of ALD processes, there is an ongoing need for new ALD chemistries.

Silicon nitride is a commonly used dielectric throughout the semiconductor industry. However, there is an increasing need for dielectrics with lower dielectric constant (k) values and with lower etch rates. Thus, there is a need for ALD chemistries of improved dielectrics.

SUMMARY

One aspect of the invention pertains to a method of depositing a film comprising Si, C and N. In one or more embodiments, the method comprises exposing a substrate surface to a silicon precursor, wherein the silicon precursor is halogenated with Cl, Br or I, and the silicon precursor comprises a halogenated silane, a halogenated carbosilane, an halogenated aminosilane or a halogenated carbo-sillyl amine. The method may also comprise exposing the substrate to a nitrogen-containing plasma, with the proviso that if the halogenated silicon precursor comprises the halogenated aminosilane or the halogenated silane, then the nitrogen-containing plasma also contains carbon.

Another aspect of the invention pertains to a method of depositing a film comprising Si, C and N. In one or more embodiments, the method comprises exposing a substrate surface to a silicon precursor, wherein the silicon precursor is halogenated with Cl, Br or I, and the silicon precursor comprises a halogenated silane, a halogenated carbosilane, an halogenated aminosilane or a halogenated carbo-sillyl amine. The method may further comprise exposing the substrate surface to a nitrogen precursor to provide a film. The method may further comprise exposing the film to a densification plasma, with the proviso that if the halogenated silicon precursor comprises the halogenated aminosilane or the halogenated silane, then the nitrogen precursor also contains carbon.

A third aspect of the invention pertains to a method of depositing a film comprising Si, C and N, the method comprising exposing a substrate surface to a silicon precursor, wherein the silicon precursor is halogenated with Cl, Br or I, and the silicon precursor comprises a halogenated bis(silyl) methane-based precursor, a halogenated cyclotrisilazane-based precursor or a halogenated trisilacyclohexane-based precursor. The method may further comprise exposing the substrate to a nitrogen-containing plasma or a nitrogen precursor.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 2A-B show a transmission electron microscope image of a film deposited according to one or more embodiments of the invention over a substrate with features and a flat substrate, respectively;

DETAILED DESCRIPTION

Figure 1:
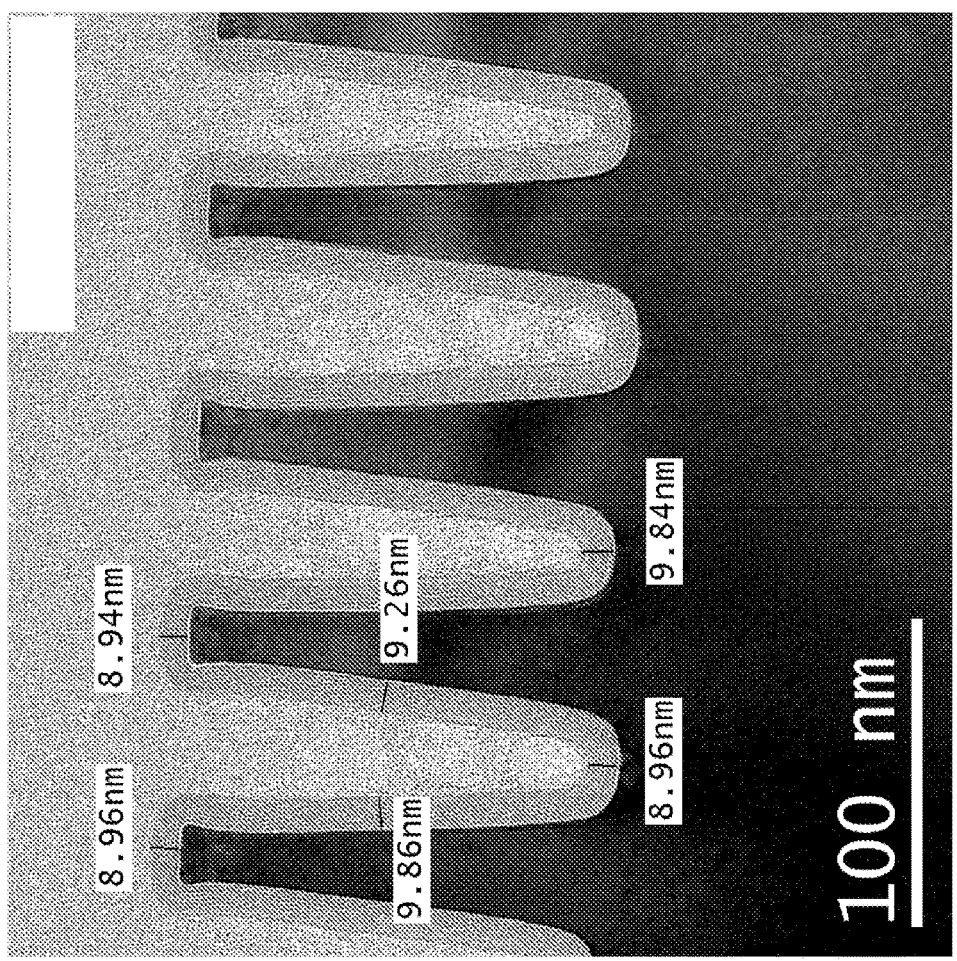
FIG. 1 shows a transmission electron microscope image of a film deposited according to one or more embodiments of the invention over a substrate with features.

Before describing several exemplary embodiments of the invention, it is to be understood that the invention is not limited to the details of construction or process steps set forth in the following description. The invention is capable of other embodiments and of being practiced or being carried out in various ways. It is also to be understood that the complexes and ligands of the present invention may be illustrated herein using structural formulas which have a particular stereochemistry. These illustrations are intended as examples only and are not to be construed as limiting the disclosed structure to any particular stereochemistry. Rather, the illustrated structures are intended to encompass all such complexes and ligands having the indicated chemical formula.

It has been discovered that SiCN films can be deposited using certain silicon precursors which comprise certain halogenated silicon precursors. Deposition may also include nitrogen-containing plasmas, or nitrogen precursors and densification plasmas. The resulting SiCN films can exhibit better dielectric constants than the more conventional SiN films. Specifically, the carbon content can lower the dielectric constant, which in turn lowers leakage at a transistor level. Furthermore, one or more of the methods described herein allow for variation of the precursors and/or plasmas to control the specific bonding in the SiCN films, allowing one to have control over the properties of the film when a film is chosen for a given application or use.

Conformal coverage with low pattern loading effect of dielectric films on high aspect ratio structures are of critical requirement as device nodes shrink down to below 45 nm. Silicon carbon nitride (SiCN) films are good candidates for spacer and etch-stop layer applications due to its lower dielectric constant (k). A lower dielectric constant improves RC capacitor delay, and therefore device performance. Moreover, carbon addition results in a film with more resistance to hydrofluoric acid in peroxide (HF) and buffer oxide etch (BOE) wet clean. Therefore, thinner film is chosen to have same barrier effect for the spacer, which is a critical requirement as devices move to smaller nodes.

Accordingly, a first aspect of the invention pertains to a method of depositing a film comprising Si, C and N (i.e., comprising an SiCN film). In one or more embodiments, the method comprises exposing a substrate surface to a silicon precursor, wherein the silicon precursor is halogenated with Cl, Br or I, and the silicon precursor comprises a halogenated silane, a halogenated carbosilane, an halogenated aminosilane or a halogenated carbo-sillyl amine. In some embodiments, the method also comprises exposing the substrate to a nitrogen-containing plasma. In other embodiments, the method also comprises exposing the substrate surface to a nitrogen precursor to provide a film, and exposing the film to a densification plasma. In embodiments where the halogenated silicon precursor comprises the halogenated aminosilane or the halogenated silane, then the nitrogen-containing plasma also contains carbon.

Therefore, in several embodiments, film deposition can proceed in two or three steps. In one or more embodiments, the method may comprise silicon precursor exposure followed by a nitrogen-containing plasma. In other embodiments, the method may comprise silicon precursor exposure followed by a nitrogen precursor exposure for a thermal ALD reaction, then followed by a plasma treatment for film densification.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Silicon Precursors

As discussed above, the silicon precursors comprise a halogenated silane, a halogenated carbosilane, an halogenated aminosilane or a halogenated carbo-sillyl amine. That is, the silicon precursors comprise at least silicon, and then a combination of carbon and/or nitrogen. In embodiments where the silicon precursor does not contain either nitrogen and/or carbon, then another plasma or precursor may provide a source of the nitrogen and/or carbon in order to result in a SiCN film.

In one or more embodiments, the silicon precursors of the instant invention allowed for highly tailored film compositions that are conformal and contain a chosen film composition and bond configurations. In contrast, previously used silicon precursors do not allow for such tailored films.

Carbon atoms in previously used precursors bond to silicon atoms as terminal $C_xH_y$ after reacting with N-precursors, such as ammonia ($NH_3$) or nitrogen gas ($N_2$). Under stress of thermal cycling, such as front-end-of-line (FEOL) processing anneal (which may reach temperatures as high as 1050° C.), $C_xH_y$ will dissociate and reform as a more conductive Si—C—Si network. As a result, the dielectric properties degrade after thermal anneal.

Different types of bonding may be chosen for certain applications, and dependent on the types of processing that will occur after the film is deposited. For example, bonds of Si to either —N or —CN groups, rather than to H or —$CH_x$, generally result in more stable films with thermal anneal. Other stable bonds that have good stability are variations of Si—$C_xN_y$, where x+y=4 such as $N_3$—Si—CN, or $C_3$—Si—CN or $N_2$—Si—C—CN. To improve the breakdown voltage further, the relative amount of Si—N bonds may be increased. In some embodiments, stable SiN bonds in this manner are Si—NH—CN or $Si_2$-N—CN. In one or more embodiments, CN is bonded to Si. With one or more of the precursors of the instant application, these —N and —CN bonds can either be pre-formed in the Si precursors or may form from the reaction of N-precursors such as $NH_3$ or $N_2$. To preserve the as-deposited high breakdown voltage similar to silicon nitride, the films may have Si bonded to N atoms. However, since films with more SiN and CN bonds can have higher HF-clean etch rate, a small percentage of SiC network may still be used to meet etch rate requirements. To lower the etch rate, the C content of the film may be increased while maintaining the thermal stability achieved with Si—CN bonds. In sum, CN is generally more thermally stable than $SiCH_3$, SiH or CH bonds, suitable for providing low k dielectric properties. SiC bonding can confer HF resistance, and SiN for good dielectric strength. The particular parameters of a given application can thus be met by varying and balancing the type and prevalence of bonding in the film.

In one or more embodiments, the precursor contains direct Si—C bonds or Si—C—Si bonds to incorporate carbon and therefore lower the etch rate of the deposited film, as well as Si—Cl bonds used for self-saturating behavior and sufficient reactivity with nitridation sources (NH$_3$, NH$_3$ plasma, N$_2$ plasma . . . etc) during atomic layer deposition.

In embodiments incorporating Si—CH$_2$—CN or Si—CN moieties into the film, the starting silicon precursors may comprise —CN (nitrile) groups and/or —HCNR (imido) groups. In the absence of —CN groups in the film, this bond may be formed during the deposition. In one or more embodiments, this bond is formed by using a nitrogen-containing plasma and a carbon-containing silicon precursor. In alternative embodiments, these bonds may be formed by using a silicon precursor either with carbon (e.g., bis (trichlorosilyl)methane (BTCSM), methane dichlorosilane (MDCS)) or without carbon (i.e., DCS) and a nitrogen-containing plasma optionally containing carbon if the silicon precursor does not contain carbon (such as alkyl amine) in the presence or absence of NH$_3$. These processes therefore allow for control the carbon content. Because the various types of bonding can be controlled in the resulting films, one of more of the SiCN films described herein are suitable for spacer and etch-stop layer applications.

In one or more embodiments, the silicon precursor contains between one and four halogen atoms per silicon atom. These halogen-terminated bonds can provide the self-limiting reaction behavior associated with ALD. Thus, for example, the hydrogen atoms in silane (SiH$_4$) may be replaced 1, 2, 3 or 4 times with a halogen (e.g., chlorine) to produce monochlorosilane, dichlorosilane (DCS), trichlorosilane or silicon tetrachloride. The halogen may be selected from the group consisting of Cl, Br and I, and in further embodiments, Cl. In some embodiments where the silicon precursor also contains carbon, bromine is used as the halogen. In one or more embodiments, the silicon precursor features at least one H—N bond, which can increase reactivity of the molecule.

In some embodiments, the silicon precursor does not contain carbon. In embodiments where the silicon precursor does not contain carbon, some other carbon source may be provided. For example, if a plasma is used, the plasma may be a carbon source. In some embodiments, a plasma may be dual function (e.g, be a densification plasma as well as providing a carbon source for the film). In alternative embodiments, the silicon precursor does contain carbon. In such embodiments, other components used in making the film (i.e., other precursor or film) may or may not also contain carbon. Using other precursors or films that also contain carbon may help in increasing the overall carbon content of the film.

In some embodiments, the silicon precursor is silane-based, such as halogenated silane (SiH$_4$), disilane (Si$_2$H$_6$), trisilane (Si$_3$H$_8$), etc. The silane-based silicon precursors may features one or more, and up to all, of the hydrogen atoms replaced with halogen atoms. Examples of suitable precursors therefore comprise monochlorosilane, dichlorosilane, trichlorosilane, or silicon tetrachloride, hexalorodisilane (HCDS).

In one or more embodiments, the silicon precursor comprises a halogenated carbosilane. Suitable halogenated carbosilanes include, but are not limited to, those based on 1,4-disilabutane, 1,3-disilabutane, 1,3,5-trisilapentane, 1,3-disilacyclobutane and 1,3,5-trisilacyclohexane, etc.

In some embodiments, the silicon precursor has a formula (X$_y$H$_{3-y}$Si)$_z$CH$_{4-z}$, wherein X is a halogen, y has a value of between 1 and 3, and z has a value of between 1 and 3. In one or more embodiments, each X is independently selected from Cl, Br and I. In further embodiments, embodiments at least one of the X groups is Cl. In even further embodiments, all X groups are Cl. Such a compound is known as bis (trichlorosilyl)methane (BTCSM), hexachlorodisilylmethylene (HCDSM), 1,1'-methylenebis(1,1,1-trichlorosilane), or methylenebis(trichlorosilane), and has a structure represented by:

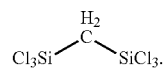

Other examples of suitable precursors include, but are not limited to those having a structure represented by:

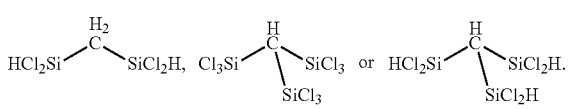

BTCSM may be utilized as a source of Si and C atoms source. In BTCSM molecules, the methylene group (—CH$_2$—) is sandwiched between two —SiCl$_3$ groups. While not wishing to be bound to any particular theory, it is thought that when reacting molecules such as BTCSM with a nitrogen source (e.g., NH$_3$ and/or N$_2$), one portion of the molecule will form SiN, while the other half will form SiCN. Both types of bonding can be advantageous for high breakdown voltage and good thermal stability. The reaction is thought to be self-limiting because of the halogen-terminated bonds, which allows for excellent step coverage.

In one or more embodiments, the silicon precursor comprises a halogenated bis(silyl) methane precursor. In further embodiments, the halogenated bis(silyl) methane-based precursor has a structure represented by formula (I):

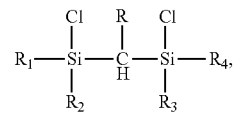

wherein each R, R$_1$, R$_2$, R$_3$ and R$_4$ is independently H, Cl or (CH$_2$)$_n$CH$_y$NA$_y$;

n=0-6;

y=0-1;

A=C$_{1-6}$ linear, branched or cyclic alkyl or aryl group or hydrogen.

Examples of suitable A substituents include, but are not limited to, methyl, ethyl, propyl, cyclohexyl or phenyl. In one or more embodiments, at least one of R, R$_1$, R$_2$, R$_3$, or R$_4$ is (CH$_2$)$_n$CH$_y$NA$_y$. In further embodiments at least one of R, R$_1$, R$_2$, R$_3$, or R$_4$ is Cl. In some embodiments, n is a non-negative integer. In some embodiments, y is 1. In other embodiments, n and/or y are zero. In one or more embodiments, the R groups can be functionalized with a variety of groups (alkyls, nitriles, imidos, halides) to increase C, N and CN content in the film, as well as to increase halogen content for reactivity enhancement in the precursor.

In further embodiments, the halogenated bis(silyl) methane-based precursor is selected from the group consisting of:

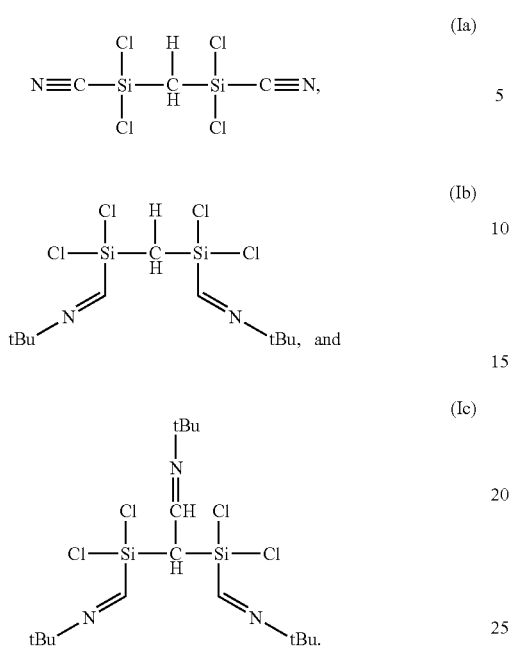

In other embodiments, the silicon precursor comprises a cyclotrisilazane-based precursor. Cyclotrisilazanes contain R groups that can be functionalized with alkyls, nitriles, and imidos for tuning of the resulting films properties. In addition, there are three Si—N—Si or Si—C—Si fragments which should result in longer chains of Si—C—Si or Si—N—Si within the deposited film. In further embodiments, the cyclotrisilazane-based precursor has a structure represented by:

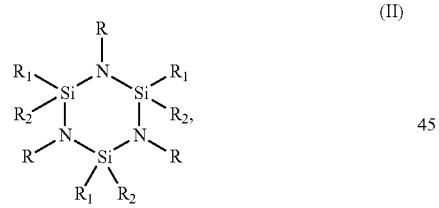

wherein each R is independently is H or $(CH_2)_nCH_yNA_y$;

each $R_1$, and $R_2$ are independently H, Br, Cl, I or $(CH_2)_nCH_yNA_y$, with the proviso that at least one $R_1$ or $R_2$ is Br, Cl or I;

n=0-6;

y=0-1;

A=$C_{1-6}$ linear, branched or cyclic alkyl or aryl group or hydrogen.

Examples of suitable A substituents include, but are not limited to, methyl, ethyl, propyl, cyclohexyl or phenyl. In one or more embodiments, at least one of R, $R_1$ and $R_2$, is $(CH_2)_nCH_yNA_y$. In further embodiments, at least one of R, $R_1$ and $R_2$, is a halogen, particularly chlorine.

In further embodiments, the cyclotrisilazane-based precursor is selected from the group consisting of:

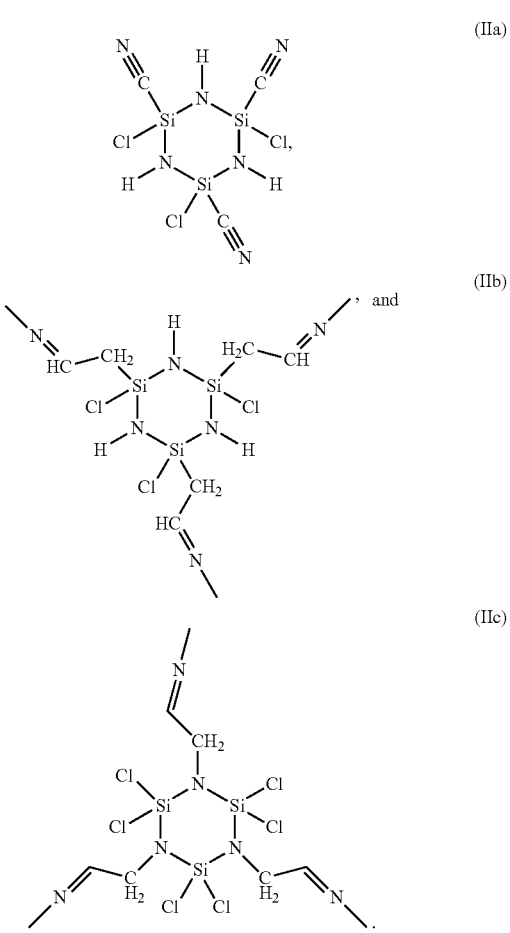

Trisilacyclohexanes also contain R groups that can be functionalized with alkyls, nitriles, and imidos for tuning of the resulting films properties. In addition, there are three Si—N—Si or Si—C—Si fragments, which are thought to result in longer chains of Si—C—Si or Si—N—Si within the deposited film. In some embodiments, the silicon precursor comprises a trisilacyclohexane-based precursor. In further embodiments, the trisilacyclohexane-based precursor has a structure represented by:

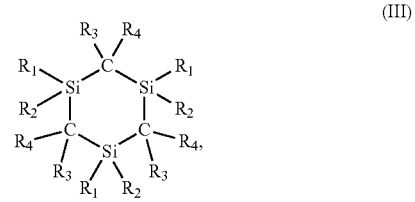

wherein each R, $R_1$, $R_2$, $R_3$ and $R_4$ is independently H, Br, Cl, I or $(CH_2)_nCH_yNA_y$;

n=0-6;

y=0-1;

A=$C_{1-6}$ linear, branched or cyclic alkyl or aryl group or hydrogen.

Examples of suitable A substituents include, but are not limited to, methyl, ethyl, propyl, cyclohexyl or phenyl. In one or more embodiments, at least one of R, $R_1$, $R_2$, $R_3$ and $R_4$ is $(CH_2)_nCH_yNA_y$. In some embodiments, at least one of R, $R_1$, $R_2$, $R_3$ and $R_4$ is a halogen, particularly chlorine. In further embodiments, the trisilacyclohexane-based precursor is selected from the group consisting of:

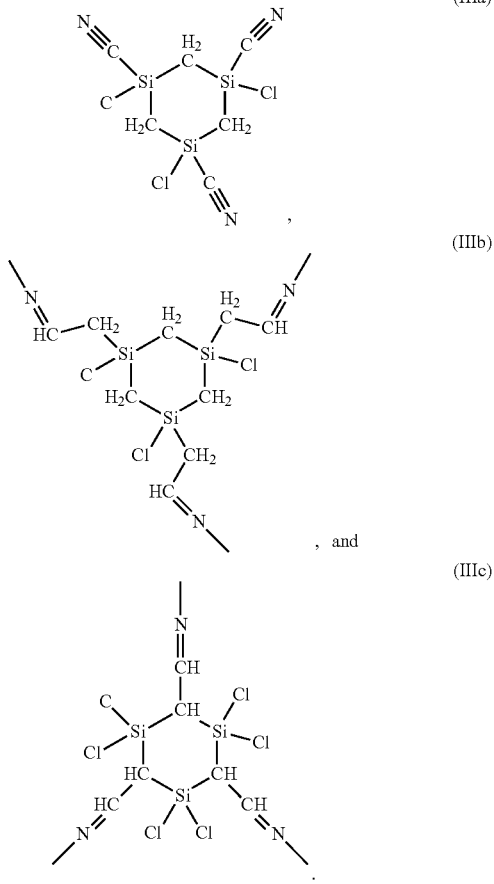

Exposing the Substrate to a Nitrogen-Containing Plasma

In one or more embodiments, the method comprises exposing the substrate surface to a nitrogen-containing plasma. In some embodiments, the nitrogen-containing plasma comprises ammonia, an amine, hydrazine or carbonitride. As discussed above, the nitrogen-containing plasma may or may not contain carbon depending on the silicon precursor used, and depending on whether there are other sources of carbon. In embodiments where the silicon precursor does not contain carbon, then the nitrogen-containing plasma may have carbon, so that there is at least one source of carbon for the SiCN film. Examples of plasmas that contain nitrogen and carbon include plasmas comprising alkyl amines, such as methyl amine, ethyl amine, dimethyl amine, diethyl amine, trimethyl amine, triethyl amine, methyl ethyl amine, dimethyl ethyl amine, tert-butyl amine, etc. Where a silicon precursor is used that does contain carbon, then the nitrogen-containing plasma does not need to also contain carbon, although it may also contain carbon to increase the carbon content of the resulting film.

In one or more embodiments, the nitrogen-containing plasma is a mixture of compounds. Thus, for example, the nitrogen-containing plasma may comprise $N_2$, as well as other components. Other components include, but are not limited to ammonia, amines, and carbon-containing components.

In some embodiments, the nitrogen-containing plasma also contains a diluting component. For example, the nitrogen-containing plasma may be diluted with argon, helium or other inert dilution plasma. In one or more embodiments, the exposure of the substrate surface to a halogenated silicon precursor and nitrogen-containing plasma occurs in one chamber.

Exposing the Substrate Surface to a Nitrogen Precursor

In some embodiments, the method comprises exposing the substrate surface to a nitrogen precursor to provide a film. In further embodiments, the nitrogen precursor comprises ammonia, alkyl amine or other amine. In some embodiments, ammonia is utilized for thermal reactions, and nitrogen or nitrogen with ammonia for plasma-based reactions. As discussed above, the nitrogen precursor may or may not contain carbon depending on the silicon precursor used, and whether there are other sources of carbon. In embodiments, where the silicon precursor does not contain carbon, then the nitrogen precursor may have carbon, so that there is at least one source of carbon for the SiCN film. Where a silicon precursor is used that does contain carbon, then the nitrogen precursor does not need to also contain carbon, although it may also contain carbon to increase the carbon content of the resulting film.

In one or more embodiments, the silicon precursor comprises a halogenated silane and the nitrogen precursor comprises ammonia. In some embodiments, the silicon precursor comprises a halogenated carbosilane and the nitrogen precursor comprises an alkyl amine.

Exposing the Film Comprising Si and N to a Densification Plasma

In one or more embodiments, the method comprises exposing the film comprising Si and N to a densification plasma. Densification plasmas allow for removal of hydrogen. Any densification plasmas known in the art may be utilized, including, but not limited to, hydrogen gas ($H_2$), nitrogen gas ($N_2$), etc.

In some embodiments, the exposure of the substrate surface to a halogenated silicon precursor, nitrogen precursor and densification plasma occurs in one chamber.

In one or more embodiments, the method further comprises exposing the film comprising Si and N to a carbon source. In some embodiments, the carbon source comprises exposing the film comprising Si and N to a compound with a C=C bond. An exemplary carbon source is propylene. When plasma is used for the reaction, other carbon sources can be used as well: methane, acetylene.

Process Conditions and Equipment

The specific reaction conditions for the ALD reaction will be selected based on the properties of the film precursors, plasmas, any other reagents and substrate surface. The deposition may be carried out at atmospheric pressure, but may also be carried out at reduced pressure. The vapor pressure of the catalyst should be low enough to be practical in such applications. The substrate temperature should be low enough to keep the bonds of the substrate surface intact and to prevent thermal decomposition of gaseous reactants. However, the substrate temperature should also be high enough to keep the film precursors in the gaseous phase and to provide sufficient energy for surface reactions. The specific temperature depends on the specific substrate, film precursors, and catalyst used and pressure. The properties of the specific substrates, precursors, plasmas, and any other reagents may be evaluated using methods known in the art, allowing selection of appropriate temperature and pressure for the reaction. In any event, in one or more embodiments, the deposition is carried out at a temperature less than about 550, 500, 450 400, 350, 300, 250 or 200° C.

In some embodiments, the substrate surface that will be exposed to various precursors contains a layer that allows the reaction of either the first or second precursors. Examples include layers that contain reactive —OH or —NH moieties or handles.

One or more of the methods described above may be an atomic layer deposition (ALD) process. In such embodiments, the substrate surface is exposed to the precursors sequentially or substantially sequentially. As used herein throughout the specification, "substantially sequentially" means that a majority of the duration of a precursor exposure does not overlap with the exposure to a co-reagent, although there may be some overlap.

One or more of the methods described above may be a chemical vapor deposition (CVD) process. In such embodiments, the substrate surface is exposed to the precursors simultaneously or substantially simultaneously. As used herein throughout the specification, "substantially simultaneously" means that the majority of the duration of a precursor exposure overlaps with the exposure to a co-reagent, although they may not be exactly co-extensive.

In one or more embodiments, once a process has been carried out, it may be repeated to achieve additional layers of film deposition. The process may be repeated as necessary to achieve predetermined film thicknesses. Additionally, certain parts of the methods described herein may be repeated. For example, in some embodiments relating to a thermal ALD of SiN process followed by densification plasma, the thermal ALD process may be repeated several times prior to exposure to the densification plasma.

In some embodiments, films formed may be laminated to achieve the predetermined film properties. For example, a film can be deposited by alternating film layers deposited by thermal-only exposures, which enables good control over the carbon of the film and plasma-assisted atomic layer deposition. It is thought that the film layers deposited by plasma process will contain a higher Si—N network boding which may result in superior dielectric breakdown, as well as modify the "thermal ALD" layer to increase density and modulate the carbon bonding (i.e., controlling the ration of Si—CN Si—C—CN for low k and Si—C—Si network for low etch rate).

In one or more embodiments, the methods described above may be combined with other film deposition processes. That is, in some embodiments, the above methods may be used to deposit SiCN over or under other films to achieve an overall composition. For example, SiCN deposition may be combined with alternating layers of SiN, SiC, and SiCN deposition by methods known in the art. In some embodiments, a low-k dielectric, thermally stable film (containing —CN or —C—CN) and having good electrical properties (—SiN bonds) and good HF-solution etch resistance can be achieved by adding carbon to a SiN monolayer. Examples of this approach would utilize HCDS or DCS as ALD silicon precursors, and reacting with $NH_3/N_2$ and a hydrocarbon (e.g., $CH_4$ or $C_2H_2$). In embodiments where the chosen film is for application as a laminated spacer material, the method may further comprise an ex-situ plasma treatment to satisfy integration requirements.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. The details of one such staged-vacuum substrate processing apparatus is disclosed in U.S. Pat. No. 5,186,718, entitled "Staged-Vacuum Wafer Processing Apparatus and Method," Tepman et al., issued on Feb. 16, 1993. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate is moved relative to the gas distribution plate, or vice-versa.

In embodiments, where one or more of the parts of the methods takes place in one chamber, the process may be a spatial ALD process. Although one or more of the chemistries described above may not be compatible (i.e., result in reaction other than on the substrate surface and/or deposit on the chamber), spatial separation ensures that the reagents are not exposed to each in the gas phase. For example, temporal ALD involves the purging the deposition chamber. However, in practice it is sometimes not possible to purge all of the excess reagent out of the chamber before flowing in additional regent. Therefore, any leftover reagent in the chamber may react. With spatial separation, excess reagent does not need to be purged, and cross-contamination is limited. Furthermore, a lot of time can be required to purge a chamber, and therefore throughput can be increased by eliminating the purge step.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

EXAMPLES

Example 1

Film Deposition Over Spacer

A film comprising SiCN was deposited using BTCSM, $NH_3$, $N_2$, $H_2$ and Ar carrier. The substrate was exposed to alternating doses of the reagents (i.e., in an atomic layer deposition process). Film deposition took place at a substrate temperature of 480° C. with a chamber pressure of 50 Torr. The film was deposited onto a poly-silicon structure with dense 5:1 aspect ratio (AR) substrate.

FIG. 1 shows a transmission electron microscope (TEM) photograph of the deposited film. The figure demonstrates the high conformality of the nitride spacer as deposited on the substrate. Since the films are deposited in ALD-mode, both films have excellent step coverage and low pattern loading (PLE) defined as thickness difference between dense structure and open areas. The resulting side to top coverage was 97%.

Example 2

Film Deposition Over Spacer and Blanket Deposition

A film comprising SiCN was deposited using BTCSM, $N_2$, $H_2$, $NH_3$ with Ar plasma source. The substrate was exposed to alternate exposures of the reagents (i.e., in an atomic layer deposition process). Film deposition took place at a substrate temperature of 400° C. with a chamber pressure of 5 Torr. The film was deposited onto a poly-silicon structure with dense 5:1 aspect ratio (AR) substrate, as well as onto a bare silicon substrate FIGS. 2A and 2B show TEM pictures of the deposited film. The photographs show the conformality of the nitride spacer deposited by on the poly-silicon structures in dense 5:1 AR as well as on open bare silicon substrate. The resulting side to top step coverage is 95% and PLE=5%.

Example 3

FTIR Analysis

Figure 3A:
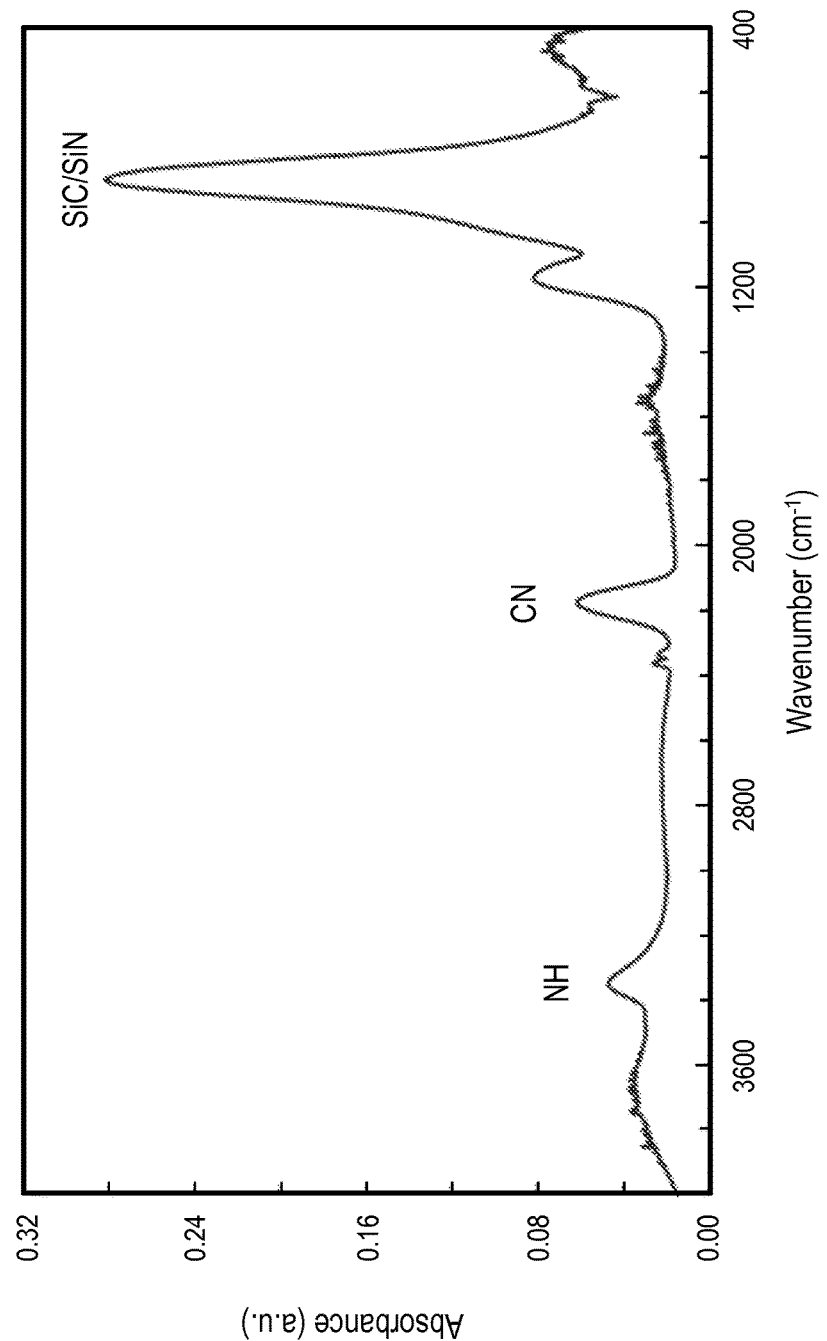
FIGS. 3A-B shows the FTIR spectra of two films deposited in accordance with one or more embodiments of the invention.
Figure 3B:
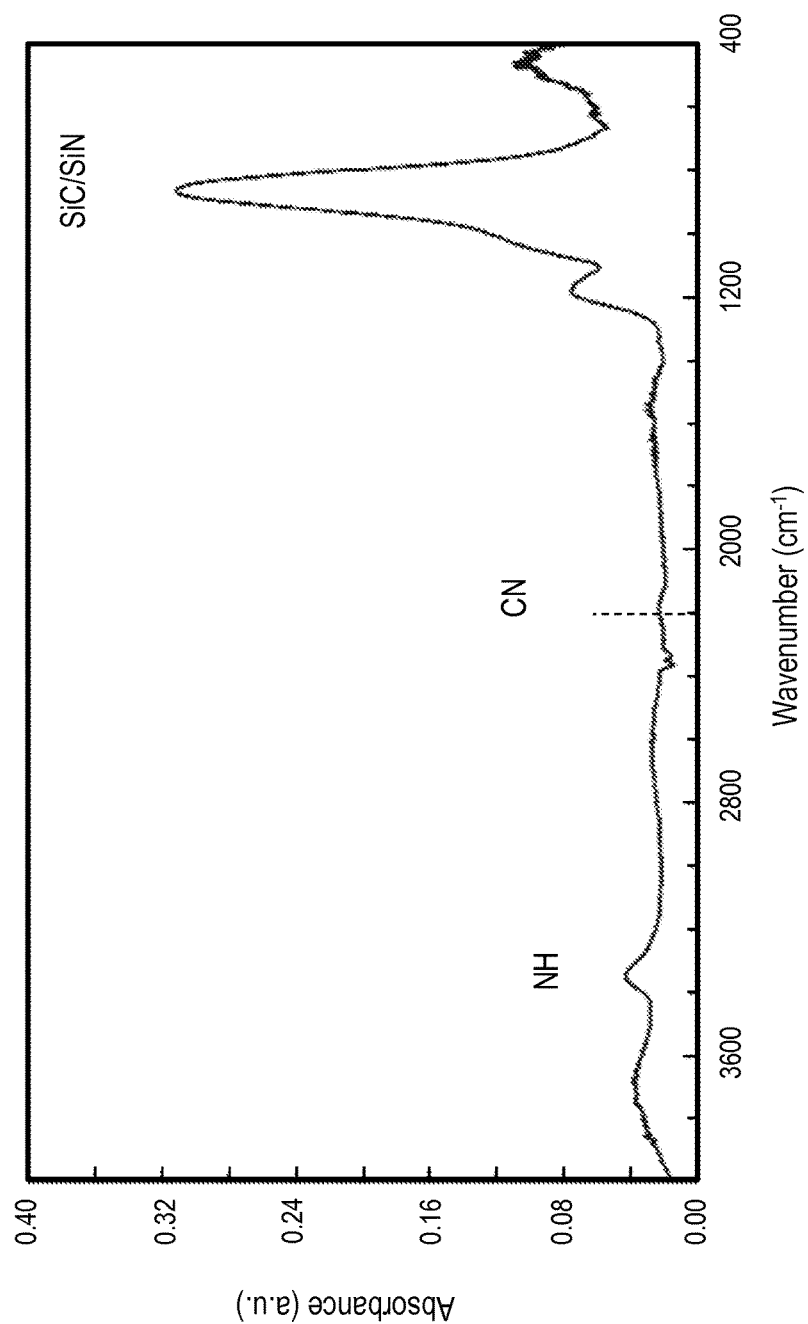

The Fourier Transform Infrared (FTIR) spectra for the films in Examples 1 and 2 are shown in FIGS. 3A-B, respectively. As seen in the figure, the films have no or minimal terminal —$CH_x$ bonds as-deposited, which is indicated by the absence of a peak at 2900 $cm^{-1}$. The —CN bonds are present in the film, as indicated by the pronounced peak at 2200 $cm^{-1}$. With different reaction conditions, the films have different compositions as indicated in the FTIR.

Example 4

Breakdown Voltage and Dielectric Constant

Figure 4A:
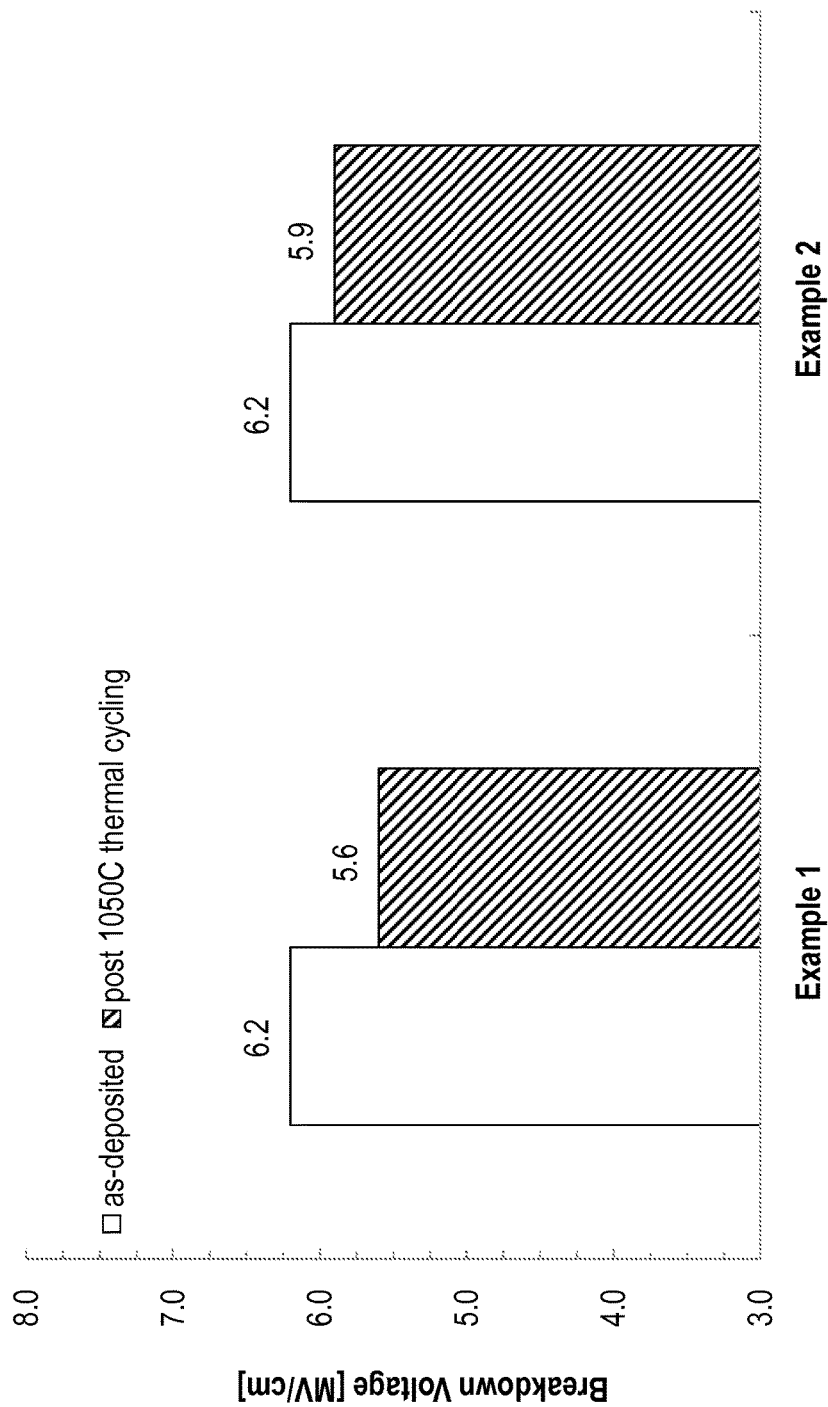
FIGS. 4A-B show the breakdown voltage and dielectric constant k for two films deposited in accordance with one or more embodiments of the invention.
Figure 4B:
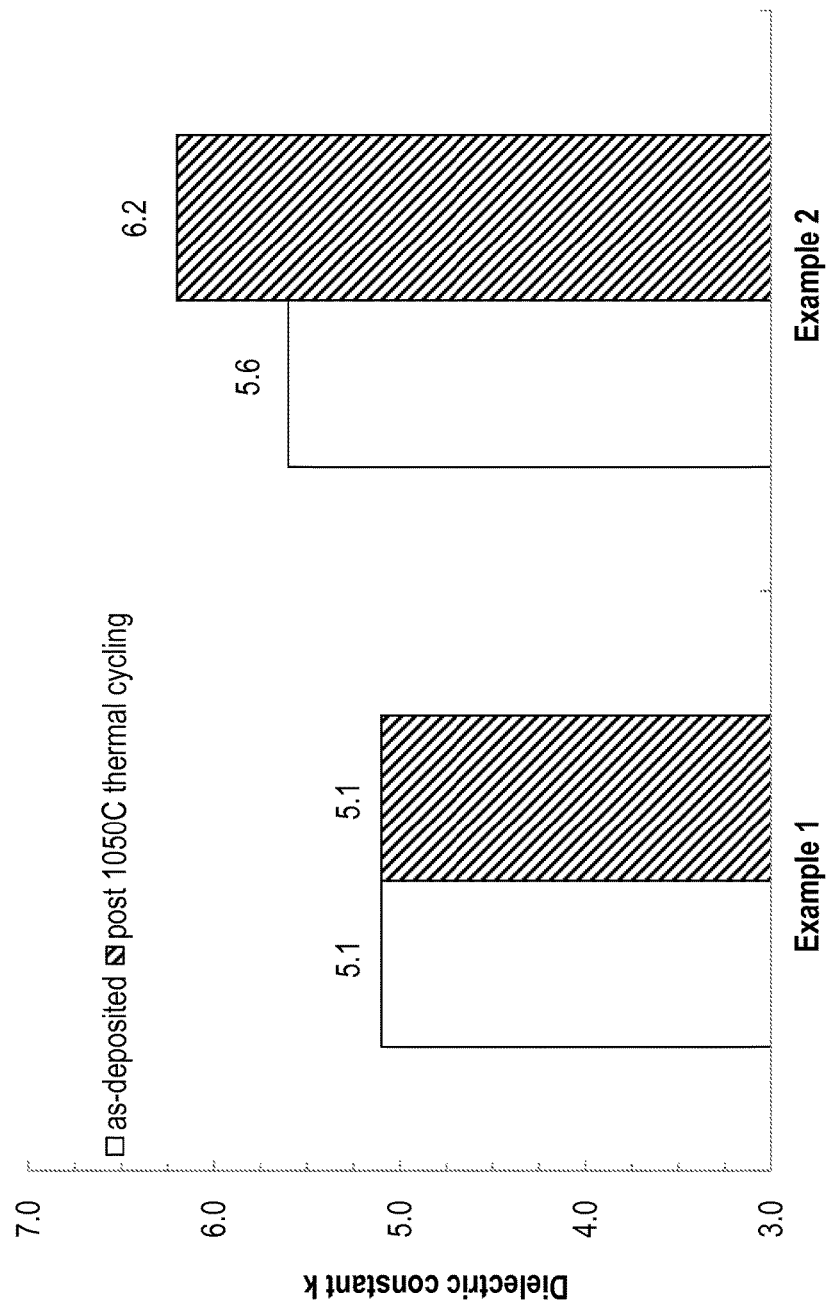

The breakdown voltage and dielectric constant of the film of Examples 1 and 2 were measured. The film was subjected to a rapid thermal processing (RTP) process (1050° C. spike anneal in $N_2$). The results are shown in FIGS. 4A and B, respectively. Because of the presence of —CN bonds, the breakdown voltage plus dielectric constant are stable post-RTP. The dielectric constants for the SiCN films which are as low as 5.1 are lower than typical values of 6.5 to 7.0 for SiN.

What is claimed is:

1. A method of depositing a film comprising Si, C and N, the method comprising:

exposing a substrate surface to a silicon precursor, wherein the silicon precursor is halogenated with Cl, Br or I, and the silicon precursor comprises a halogenated cyclotrisilazane-based precursor having a structure represented by

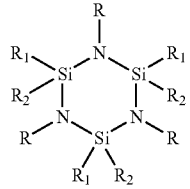

wherein each R is independently is H or $(CH_2)_nCH_yNA_y$, each $R_1$, and $R_2$ are independently H, Br, Cl, I or $(CH_2)_nCH_yNA_y$, n =0-6, y =0-1, A =$C_{1-6}$ linear, branched or cyclic alkyl or aryl group or hydrogen, with the proviso that at least one $R_1$ or $R_2$ is Br, Cl or I and at least one of R, $R_1$ or $R_2$ is $(CH_2)_nCH_yNA_y$; and exposing the substrate to a nitrogen-containing plasma.

2. The method of claim 1, wherein the nitrogen-containing plasma comprises ammonia, an amine or carbonitride.

3. A method of depositing a film comprising Si, C and N, the method comprising:

exposing a substrate surface to a silicon precursor, wherein the silicon precursor is halogenated with Cl, Br or I, and the silicon precursor comprises a halogenated cyclotrisilazane-based precursor having a structure represented by

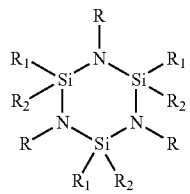

wherein each R is independently is H or $(CH_2)_nCH_yNA_y$, each $R_1$, and $R_2$ are independently H, Br, Cl, I or $(CH_2)_nCH_yNA_y$, n =0-6, y =0-1, A =$C_{1-6}$ linear, branched or cyclic alkyl or aryl group or hydrogen, with the proviso that at least one $R_1$ or $R_2$ is Br, Cl or I and at least one of R, $R_1$ or $R_2$ is $(CH_2)_nCH_yNA_y$;

exposing the substrate surface to a nitrogen precursor to provide a film; and exposing the film to a densification plasma.

4. The method of claim 3, further comprising exposing the film comprising Si and N to a carbon source.

5. The method of claim 4, wherein the carbon source comprises exposing the film to a compound with a C=C bond.

6. A method of depositing a film comprising Si, C and N, the method comprising exposing a substrate surface to a silicon precursor, wherein the silicon precursor is halogenated with Cl, Br or I, and the silicon precursor comprises a halogenated cyclotrisilazane-based precursor having a structure represented by

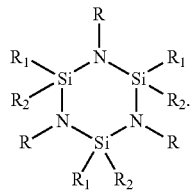

wherein each R is independently is H or $(CH_2)_nCH_yNA_y$, each $R_1$, and $R_2$ are independently H, Br, Cl, I or $(CH_2)_nCH_yNA_y$, n =0-6, y =0-1, A =$C_{1-6}$ linear, branched or cyclic alkyl or aryl group or hydrogen, with the proviso that at least one $R_1$ or $R_2$ is Br, Cl or I and at least one of R, $R_1$ or $R_2$ is $(CH_2)_nCH_yNA_y$; and exposing the substrate to a nitrogen-containing plasma or a nitrogen precursor.

* * * * *